(12) United States Patent
Kim et al.

(10) Patent No.: US 8,431,927 B2
(45) Date of Patent: *Apr. 30, 2013

(54) THIN FILM TRANSISTOR, METHOD OF MANUFACTURING THE SAME, AND ORGANIC ELECTROLUMINESCENT DEVICE INCLUDING THIN FILM TRANSISTOR

(75) Inventors: Kwang-Suk Kim, Yong (KR); Jin-Seong Park, Yong (KR)

(73) Assignee: Samsung Display Co., Ltd. (KR)

( * ) Notice: Subject to any disclaimer, the term of this patent is extended or adjusted under 35 U.S.C. 154(b) by 182 days.

This patent is subject to a terminal disclaimer.

(21) Appl. No.: 12/873,206

(22) Filed: Aug. 31, 2010

(65) Prior Publication Data

US 2011/0140096 A1    Jun. 16, 2011

(30) Foreign Application Priority Data

Dec. 15, 2009    (KR) .................. 10-2009-0125031

(51) Int. Cl.
*H01L 29/12* (2006.01)

(52) U.S. Cl.
USPC .. 257/43; 257/57; 257/E29.095; 257/E29.08; 438/104; 438/158

(58) Field of Classification Search .................. None
See application file for complete search history.

(56) References Cited

U.S. PATENT DOCUMENTS

| | | | |
|---|---|---|---|
| 7,388,262 B2 | 6/2008 | Ahn et al. | |
| 7,816,680 B2 * | 10/2010 | Kim et al. | 257/43 |
| 7,935,964 B2 * | 5/2011 | Kim et al. | 257/43 |
| 2005/0280100 A1 | 12/2005 | Artake et al. | |
| 2008/0206923 A1 | 8/2008 | Kim et al. | |
| 2008/0237598 A1 | 10/2008 | Nakayama | |
| 2008/0315200 A1 * | 12/2008 | Kim et al. | 257/57 |
| 2009/0008638 A1 | 1/2009 | Kang et al. | |
| 2009/0020753 A1 | 1/2009 | Jeong et al. | |
| 2009/0294764 A1 * | 12/2009 | Kim et al. | 257/43 |

(Continued)

FOREIGN PATENT DOCUMENTS

| | | |
|---|---|---|
| JP | 6-267867 A | 9/1994 |
| JP | 2009-021536 A | 1/2009 |

(Continued)

OTHER PUBLICATIONS

Korean Registration Determination Certificate issued by the Korean Property Office dated Nov. 21, 2011, 5 pages.

(Continued)

*Primary Examiner* — Calvin Lee
*Assistant Examiner* — Scott Stowe
(74) *Attorney, Agent, or Firm* — Knobbe Martens Olson & Bear LLP

(57) ABSTRACT

A thin film transistor including: a substrate; a gate electrode formed on the substrate; a gate insulating layer formed on the gate electrode and exposed portions of the substrate; an oxide semiconductor layer formed on the gate insulating layer to correspond to the gate electrode, and comprising an HfIn-ZnO-based oxide semiconductor, wherein the concentration of Hf is from about 9 to about 15 at % based on 100 at % of the total concentration of Hf, In, and Zn; and source and drain regions respectively formed to extend on both sides of the oxide semiconductor layer and the gate insulating layer.

21 Claims, 10 Drawing Sheets

U.S. PATENT DOCUMENTS

| | | | |
|---|---|---|---|
| 2010/0025674 A1* | 2/2010 | Kim et al. | 257/43 |
| 2010/0276683 A1* | 11/2010 | Kim et al. | 257/43 |
| 2011/0042669 A1 | 2/2011 | Kim et al. | |
| 2011/0114939 A1* | 5/2011 | Kim et al. | 257/43 |

FOREIGN PATENT DOCUMENTS

| | | |
|---|---|---|
| JP | 2009-212476 A | 9/2009 |
| KR | 10-2008-0074515 A | 8/2008 |
| KR | 10-2008-0076747 A | 8/2008 |
| KR | 10-2009-0002841 A | 1/2009 |
| KR | 10-2009-0059494 | 6/2009 |
| KR | 100916921 B1 | 9/2009 |
| KR | 10-2009-0124329 A | 12/2009 |

OTHER PUBLICATIONS

Korean Official Action issued by the Korean Industrial Property Office issued on Apr. 21, 2011, 3 pages.

Office Action dated Feb. 26, 2013, issued in connection with Japanese Patent Application No. 2010-278276.

* cited by examiner

THIN FILM TRANSISTOR, METHOD OF MANUFACTURING THE SAME, AND ORGANIC ELECTROLUMINESCENT DEVICE INCLUDING THIN FILM TRANSISTOR

CROSS-REFERENCE TO RELATED APPLICATIONS

This application claims the benefit of Korean Patent Application No. 10-2009-0125031, filed on Dec. 15, 2009, in the Korean Intellectual Property Office, the disclosure of which is incorporated herein in its entirety by reference.

BACKGROUND

1. Field

The present embodiments relate to a thin film transistor, and more particularly, to a thin film transistor including an HfInZnO-based oxide semiconductor layer as a channel layer, a method of manufacturing the same, and an organic electroluminescent device including the thin film transistor.

2. Description of the Related Technology

A thin film transistor (TFT) is a type of a field effect transistor made by depositing thin films of a semiconductor material over an insulating supporting substrate. The TFT basically includes three terminals, e.g., a gate, a drain, and a source, and mainly performs a switching operation. In the switching operation of the TFT, a voltage applied to the gate is adjusted to set a current flowing between the source and the drain in an on-state or off-state. TFTs are used in sensors, memory devices, optical devices, and the like, and are most widely used in pixel switching devices of flat panel displays.

Currently, commercially available products, such as notebook computers, PC monitors, TVs, mobile devices, and the like mostly include amorphous silicon thin film transistors (a-Si TFTs). The atom arrangement in amorphous silicon is not as regular as in crystalline silicon, and only short range order is present. As amorphous silicon may be easily deposited over large areas (such as a glass substrate) at low temperatures, amorphous silicon is most widely used in TFTs. However, as the requirements for display devices with larger sizes and higher image quality have increased, high performance thin film transistors having higher electron mobility than a-Si TFTs, e.g., 0.5 to 1 $cm^2/Vs$, and the manufacturing techniques have been required.

Poly-Si TFTs have superior performance to a-Si TFTs. Polysilicon (poly-Si) TFTs have a mobility of several tens to hundreds of $cm^2/Vs$, and thus a data driving circuit or periphery circuit required for high mobility may be embedded in a substrate. In addition, channels of such TFTs may be made short, and thus an aperture ratio of a screen may be high. Also, since the driving circuit is embedded in the substrate, there are no pitch limitations in wiring for connecting the driving circuit according to an increased number of pixels, and thus high resolution may be realized, a turn-on voltage and power consumption may be reduced, and the poly-Si TFTs may have less characteristic deterioration.

However, the crystallization process used to manufacture poly-Si TFTs is complicated, and thus the manufacturing costs may increase. In addition, due to technical problems such as manufacturing equipment limitations or uniformity defects, manufacturing of a large-scale substrate using poly-Si TFTs has not been realized up to date.

Therefore, research has been actively conducted on novel TFTs having advantages of both a-Si TFTs and poly-Si TFTs. Oxide semiconductor devices are representative examples of the TFTs.

Oxide semiconductor devices may be categorized into crystalline oxide semiconductor devices including a crystalline oxide such as ZnO and amorphous oxide semiconductor devices including an amorphous oxide such as GIZO (GaInZnO). The amorphous oxide semiconductor devices may be manufactured at a low temperature, easily be made in large sizes, and have high mobility and an excellent electric characteristic like the poly-Si TFT. Thus, research is currently being conducted in order to use an oxide semiconductor layer in a channel area of a TFT. In an oxide semiconductor, since the overlapping of a wave function of an s-orbital where electrons that are the least anisotropic according to a direction among the outermost electrons of a metal reside contributes to the band charge transfer of electrons, it is considered that an amorphous thin film fanned of the oxide semiconductor may have a high mobility, such as, 10 $cm^2/V \cdot s$ or greater.

However, recent reports have disclosed that the characteristics of commonly used InGaZnO oxide semiconductor devices deteriorate when exposed to plasma or external agents (for example, moisture, oxygen, or the like). Also, to protect the oxide semiconductor layer, an etch stop layer is formed on the oxide semiconductor layer. However, depending on the conditions for forming the etch stop layer, the characteristics of the oxide semiconductor devices may severely deteriorate. In addition, the condition ranges wherein the characteristics of the oxide semiconductor devices do not deteriorate are limited, and thus there is a need for fundamental changes in the oxide semiconductor devices.

SUMMARY

The present embodiments provide an oxide semiconductor thin film transistor having enhanced electrical characteristic and stability, a method of manufacturing the same, and an organic electroluminescent device including the thin film transistor.

According to an aspect of the present embodiments, there is provided a thin film transistor including: a substrate; a gate electrode formed on the substrate; a gate insulating layer formed on the gate electrode and exposed portions of the substrate; an oxide semiconductor layer formed on the gate insulating layer to correspond to the gate electrode, and comprising an HfInZnO-based oxide semiconductor; and source and drain regions respectively formed to extend on both sides of the oxide semiconductor layer and the gate insulating layer. In this regard, the concentration of Hf in the oxide semiconductor layer may be from about 9 to about 15 at % based on 100 at % of the total concentration of Hf, In, and Zn.

The concentration (at %) of Hf may gradually increase towards an upper portion of the oxide semiconductor layer away from a lower portion of the oxide semiconductor layer. In addition, the oxide semiconductor layer may include a first layer formed on the gate insulating layer and a second layer formed on the first layer, wherein the concentration of Hf is higher in the second layer than in the first layer.

The concentration of Zn may gradually increase towards an upper portion of the oxide semiconductor layer away from a lower portion of the oxide semiconductor layer. The oxide semiconductor layer may include a third layer formed on the gate insulating layer and a fourth layer formed on the third layer, wherein the concentration of Zn is higher in the fourth layer than in the third layer.

According to another aspect of the present embodiments, there is provided a method of manufacturing a thin film transistor, the method including: forming a gate electrode on a substrate; forming a gate insulating layer on the gate electrode and exposed portions of the substrate; forming an HfInZnO-based oxide semiconductor layer on the gate insulating layer; and forming source and drain regions respectively extending on both sides of the oxide semiconductor layer and the gate insulating layer. In this regard, the forming of the oxide semiconductor layer may be performed in such a way that the concentration of Hf is from about 9 to about 15 at % based on 100 at % of the total concentration of Hf, In, and Zn.

The forming of the oxide semiconductor layer may be performed by co-sputtering by respectively applying powers to three targets of $HfO_2$, $In_2O_3$, and ZnO. The oxide semiconductor layer may have an Hf or Zn concentration gradient by adjusting the voltages applied to the targets.

The forming of the oxide semiconductor layer may be performed in such a way that the concentration of Hf increases towards an upper portion of the oxide semiconductor layer away from a lower portion of the oxide semiconductor layer. Optionally, the forming of the oxide semiconductor layer may be performed in such a way that the concentration of Zn decreases towards an upper portion of the oxide semiconductor layer away from a lower portion of the oxide semiconductor layer, and the concentration of Zn increases away from the gate insulating layer.

According to another aspect of the present embodiments, there is provided an organic electroluminescent apparatus including the thin film transistor including an oxide semiconductor layer.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION

The present embodiments will now be described more fully with reference to the accompanying drawings, in which exemplary embodiments are shown. The present embodiments may, however, be embodied in many different forms and should not be construed as being limited to the embodiments set forth herein; rather, these embodiments are provided so that this disclosure will be thorough and complete, and will fully convey the concept of the embodiments to those skilled in the art.

The term "HfInZnO-based oxide semiconductor" used herein refers to an oxide semiconductor including hafnium (Hf), indium (In), zinc (Zn), and oxygen (O), wherein a composition ratio of Hf, In, Zn, and O may vary. In this specification, the concentration of Hf and Zn is represented by an atomic percentage (at %), and the total atomic percentage (at %) of Hf, In, and Zn is 100.

Figure 1:
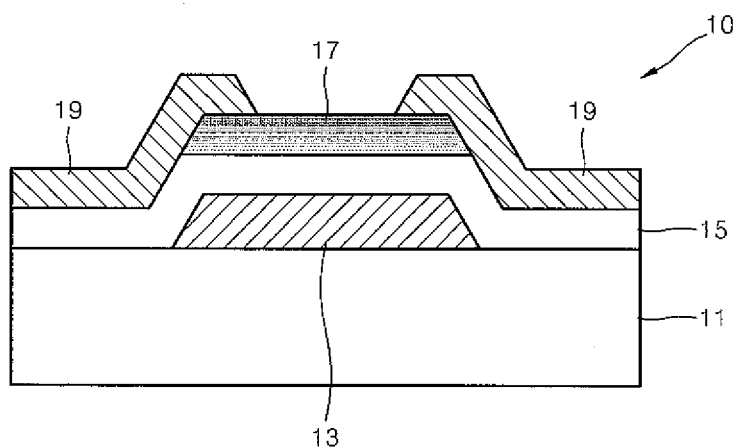
FIG. 1 is a cross-sectional view illustrating a structure of a thin film transistor including an oxide semiconductor layer, according to an embodiment.

FIG. 1 is a cross-sectional view illustrating a structure of an oxide semiconductor thin film transistor 10 including an oxide semiconductor layer, according to an embodiment.

Referring to FIG. 1, the oxide semiconductor thin film transistor 10 includes: a substrate 11; a gate electrode 13 formed on the substrate 11; a gate insulating layer 15 formed on the gate electrode 13 and exposed portions of the substrate 11; an oxide semiconductor layer 17 fowled on the gate insulating layer 15 to correspond to the gate electrode 13; source and drain 19 that are respectively formed on both sides of the oxide semiconductor layer 17 and on exposed portions of the gate insulating layer 15 so as to expose a portion of a top surface of the oxide semiconductor layer 17 and respectively contact the both sides of the oxide semiconductor layer 17. The oxide semiconductor layer 17 is formed as a channel layer. A buffer layer (not shown) may be optionally formed between the substrate 11 and the gate electrode 13 and between the substrate 11 and the gate insulating layer 15. In addition, an etch stop layer (not shown) may be optionally formed on the oxide semiconductor layer 17.

The substrate 11 may be for example, silicon (Si), glass, or plastic. The gate electrode 13 may be for example, a metal such as titanium (Ti), platinum (Pt), ruthenium (Ru), copper (Cu), gold (Au), silver (Ag), molybdenum (Mo), chromium (Cr), aluminum (Al), tantalum (Ta), tungsten (W), or alloys thereof, or a conductive oxide such as tin oxide, zinc oxide, indium oxide, indium thin oxide (ITO), indium zinc oxide (IZO), gallium zinc oxide (GZO), indium gallium oxide (IGO), or aluminum zinc oxide (AZO). For example, the gate electrode 13 may be any one of a single metal layer containing Cu or Mo, a multi-layered metal layer including a Mo-containing metal layer, a Ti-containing metal layer, and a Cr-containing metal layer.

The gate insulating layer 15 may be for example, a dielectric material such as $SiO_2$, $SiN_x$, SiON, $HfO_2$, $Al_2O_{3-}$, $Y_2O_3$, or $Ta_2O_5$, a high-K dielectric material, or mixtures thereof.

The oxide semiconductor layer 17 is for example, an HfInZnO-based oxide semiconductor. The HfInZnO-based oxide semiconductor may be amorphous or crystalline. In the oxide semiconductor layer 17, the concentration of Hf may be from about 9 to about 15 at % (atomic percentage) based on 100 at % of the total concentration of Hf, In, and Zn. The concentration of Hf in the oxide semiconductor layer 17 may decrease towards a lower portion of the oxide semiconductor layer 17 that contacts the gate insulating layer 15, and may increase towards an upper portion of the oxide semiconductor layer 17 that is exposed by source and drain 19. Thus, the concentration of Hf may have a gradual gradient in the oxide semiconductor layer 17 for example, the HfInZnO-based oxide semiconductor.

When the concentration of Hf in the HfInZnO-based oxide semiconductor increases, a structure of the HfInZnO-based oxide semiconductor becomes strong, thereby decreasing defect problems occurring when the HfInZnO-based oxide semiconductor is subjected to subsequent processes such as a thin film formation process or a plasma process. As a result, the stability of the thin film transistor increases. However, the electron mobility of the HfInZnO-based oxide semiconductor decreases, thereby reducing the electrical characteristics of the thin film transistor.

Therefore, the concentration of Hf in the oxide semiconductor layer 17 may decrease towards a portion of the oxide semiconductor layer 17 where a channel is formed, the portion contacting the gate insulating layer 15, thereby increasing the electron mobility of the HfInZnO-based oxide semiconductor and enhancing the performance of the thin film transistor. Also, the concentration of Hf in the oxide semiconductor layer 17 may increase towards an upper portion of the oxide semiconductor layer 17 that is exposed to the external agents, thereby increasing the stability of the thin film transistor.

The oxide semiconductor layer 17 may have a Zn concentration gradient in such a way that the concentration of Zn in the oxide semiconductor layer 17 may decrease towards the lower portion of the oxide semiconductor layer 17 that contacts the gate insulating layer 15, and may increase towards the upper portion of the oxide semiconductor layer 17 that is exposed by the source and drain 19. Optionally, the concentration of Hf in the oxide semiconductor layer 17 may be from about 9 to about 15 at %.

As in the case of Hf described above, when the concentration of Zn in the HfInZnO-based oxide semiconductor increases, a structure of the HfInZnO-based oxide semiconductor becomes strong, thereby limiting defect problems occurring when the HfInZnO-based oxide semiconductor is subjected to subsequent processes such as a thin film formation process or a plasma process. As a result, the stability of the thin film transistor increases. However, the electron mobility of the HfInZnO-based oxide semiconductor decreases.

Therefore, as in the case of Hf described above, the concentration of Zn in the oxide semiconductor layer 17 may decrease towards a portion of the oxide semiconductor layer 17 where a channel is formed, the portion contacting the gate insulating layer 15, thereby increasing the electron mobility of the HfInZnO-based oxide semiconductor and enhancing the performance of the thin film transistor, and the concentration of Zn in the oxide semiconductor layer 17 may increase towards an upper portion of the oxide semiconductor layer 17 that is exposed to the surrounding circumstances, thereby increasing the stability of the thin film transistor.

The source and drain 19 may be for example, the same material as the gate electrode 13, e.g., a metal such as Ti, Pt, Ru, Cu, Au, Ag, Mo, Cr, Al, Ta, W, or alloys thereof, or a conductive oxide such as tin oxide, zinc oxide, indium oxide, ITO (Indium Tin Oxide), IZO (Indium Zinc Oxide), GZO (gallium Zinc Oxide), IGO (Indium Gallium Oxide) or AZO (Aluminum Zinc Oxide). For example, the source and drain 19 may be any one of a single metal layer containing Cu or Mo, a multi-layered metal layer including a Mo-containing metal layer, a Ti-containing metal layer, and a Cr-containing metal layer.

Figure 2:
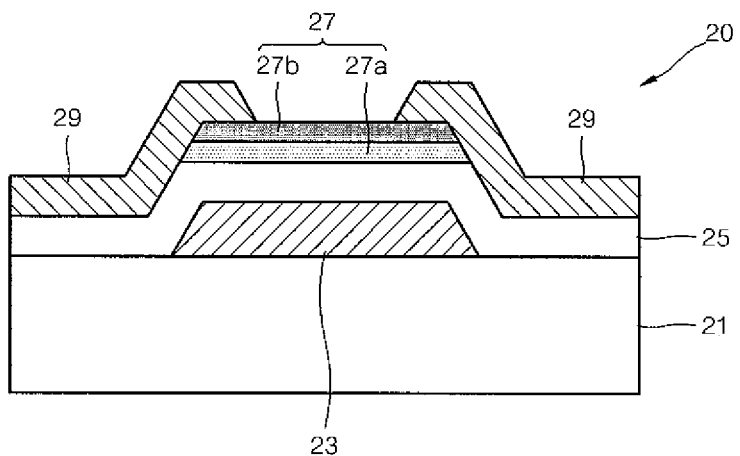
FIG. 2 is a cross-sectional view illustrating a structure of a thin film transistor including an oxide semiconductor layer, according to another embodiment.

FIG. 2 is a cross-sectional view illustrating a structure of an oxide semiconductor thin film transistor 20 including an oxide semiconductor layer, according to another embodiment. The oxide semiconductor thin film transistor 20 of FIG. 2 has the same structure as the oxide semiconductor thin film transistor 10 of FIG. 1, except that the oxide semiconductor thin film transistor 20 includes a double-layered oxide semiconductor layer.

Referring to FIG. 2, the oxide semiconductor thin film transistor 20 includes: a substrate 21, a gate electrode 23 formed on the substrate 21; a gate insulating layer 25 formed on the gate electrode 23 and exposed portions of the substrate 21; an oxide semiconductor layer 27 formed on the gate insulating layer 25 to correspond to the gate electrode 23; source and drain 29 that are respectively formed on both sides of the oxide semiconductor layer 27 and on exposed portions of the gate insulating layer 25 so as to expose a portion of a top surface of the oxide semiconductor layer 27 and respectively contact the both sides of the oxide semiconductor layer 27.

The oxide semiconductor layer 27 includes a first oxide semiconductor layer 27a formed on the gate insulating layer 25 and a second oxide semiconductor layer 27b formed on the first oxide semiconductor layer 27a. A buffer layer (not shown) may be optionally formed between the substrate 21 and the gate electrode 23 and between the substrate 21 and the gate insulating layer 25. In addition, an etch stop layer (not shown) may be optionally formed on the oxide semiconductor layer 27.

The substrate 21 may be for example, Si, glass, or plastic. The gate electrode 23 may be for example, a metal such as Ti, Pt, Ru, Cu, Au, Ag, Mo, Cr, Al, Ta, W, or alloys thereof, or a conductive oxide such as tin oxide, zinc oxide, indium oxide, ITO, IZO, GZO, IGO, or AZO. For example, the gate electrode 23 may be any one of a single metal layer containing Cu or Mo, a multi-layered metal layer including a Mo-containing metal layer, a Ti-containing metal layer, and a Cr-containing metal layer.

The gate insulating layer 25 may be for example, a dielectric material such as $SiO_2$, $SiN_x$, SiON, $HfO_2$, $Al_2O_3$, $Y_2O_3$, or $Ta_2O_5$, a high-K dielectric material, or mixtures thereof.

Each of the first oxide semiconductor layer 27a and the second oxide semiconductor layer 27b may be for example, an HfInZnO-based oxide semiconductor, and the concentration of Hf may be lower in the first oxide semiconductor layer 27a than in the second oxide semiconductor layer 27b. The HfInZnO-based oxide semiconductor may be amorphous or crystalline. Optionally, the concentration of Hf in the oxide semiconductor layer 17 may be from about 9 to about 15 at %. In the present embodiment, the oxide semiconductor layer 27 is double-layered, but the oxide semiconductor layer 27 may also be three-layered. In this regard, the concentration of Hf may be the lowest in a first oxide semiconductor layer formed right on the gate insulating layer 25, the concentration of Hf may be the highest in a third oxide semiconductor layer formed on the uppermost portion thereof, and the concentration of Hf may have a value between the highest and lowest values in a second oxide semiconductor layer formed therebetween.

The first oxide semiconductor layer 27a may act as a channel layer, and the second oxide semiconductor layer 27b may act as a channel layer and a protective layer for the first oxide semiconductor layer 27a. Thus, the deposition structure of the first oxide semiconductor layer 27a and the second oxide semiconductor layer 27b may not deteriorate the electrical characteristics of the thin film transistor and may enhance the stability of the thin film transistor.

Each of the first oxide semiconductor layer 27a and the second oxide semiconductor layer 27b may be for example, an HfInZnO-based oxide semiconductor, and the concentration of Zn may be lower in the first oxide semiconductor layer 27a than in the second oxide semiconductor layer 27b. Optionally, the concentration of Hf in the oxide semiconductor layer 27 may be from about 9 to about 15 at %. The oxide semiconductor layer 27 may also be three-layered. In this regard, the concentration of Zn may be the lowest in a first oxide semiconductor layer formed right on the gate insulating layer 25, the concentration of Zn may be the highest in a third oxide semiconductor layer formed on the uppermost portion thereof, and the concentration of Zn may have a value between the highest and lowest values in a second oxide semiconductor layer formed therebetween.

The source and drain 29 may be for example, the same material as that of the gate electrode 23, e.g., a metal such as Ti, Pt, Ru, Cu, Au, Ag, Mo, Cr, Al, Ta, W, or alloys thereof, or a conductive oxide such as tin oxide, zinc oxide, indium oxide, ITO, IZO, GZO, IGO, or AZO. For example, the source and drain 29 may be any one of a single metal layer containing Cu or Mo, a multi-layered metal layer including a Mo-containing metal layer, a Ti-containing metal layer, and a Cr-containing metal layer.

FIGS. 3A through 3D are cross-sectional views sequentially illustrating a method of manufacturing a thin film transistor, according to an embodiment.

Figure 3A:
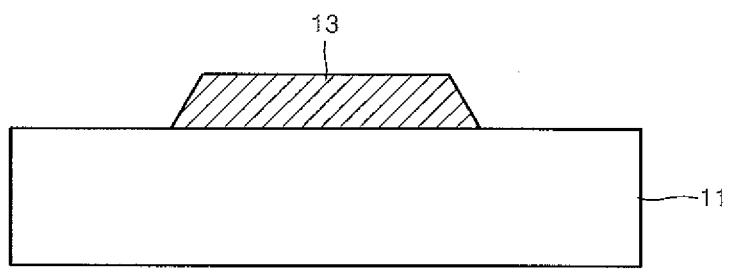
FIGS. 3A through 3D are cross-sectional views sequentially illustrating a method of manufacturing a thin film transistor, according to an embodiment.

Referring to FIG. 3A, the gate electrode 13 is formed on the substrate 11. The substrate 11 may be for example, Si, glass, or plastic.

A conductive layer for example, a metal such as Ti, Pt, Ru, Cu, Au, Ag, Mo, Cr, Al, Ta, W, or alloys thereof, or a conductive oxide such as tin oxide, zinc oxide, indium oxide, ITO, IZO, GZO, IGO, or AZO is formed on the substrate 11, and patterned to form the gate electrode 13. Optionally, a buffer layer (not shown) may be formed on the substrate 11, and the gate electrode 13 may be then formed thereon.

Figure 3B:
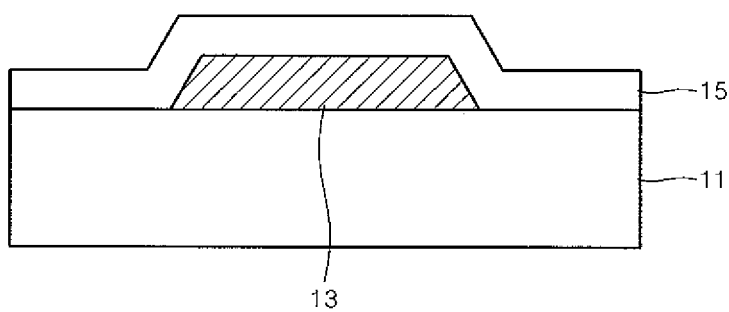

Referring to FIG. 3B, the gate insulating layer 15 is formed on the substrate 11 on which the gate electrode 13 is formed, wherein the gate insulating layer 15 is for example, a dielectric material such as $SiO_2$, $SiN_x$, SiON, $HfO_2$, $Al_2O_3$, $Y_2O_3$, or $Ta_2O_5$, a high-K dielectric material, or mixtures thereof.

Figure 3C:
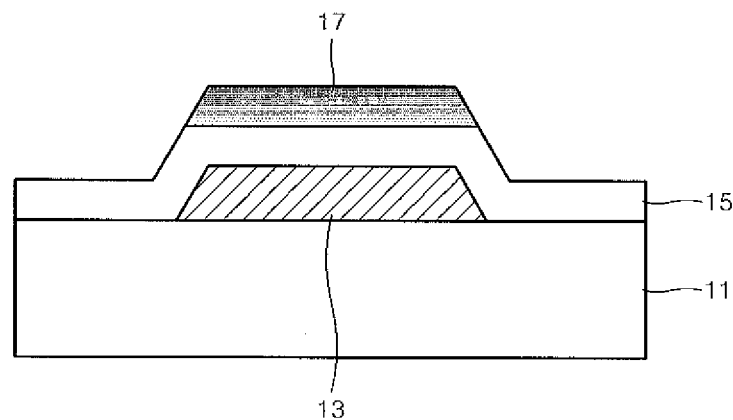

Referring to FIG. 3C, an HfInZnO-based oxide semiconductor layer is formed on the gate insulating layer 15, and is then patterned to form the oxide semiconductor layer 17. In this regard, the oxide semiconductor layer 17 is formed to have a gradual Hf concentration gradient in such a way that the concentration of Hf increases towards an upper portion of the oxide semiconductor layer 17 away from a lower portion of the oxide semiconductor layer 17 that contacts the gate insulating layer 15.

The HfInZnO-based oxide semiconductor layer may be formed by co-sputtering by respectively applying powers to three targets of $HfO_2$, $In_2O_3$, and ZnO. The HfInZnO-based oxide semiconductor may be amorphous or crystalline. In this regard, the oxide semiconductor layer 17 is formed to have a gradual Hf concentration gradient in such a way that by varying powers respectively applied to the three targets according to the sputtering time, the concentration of Hf increases towards an upper portion of the oxide semiconductor layer 17 away from a lower portion of the oxide semiconductor layer 17. In this regard, the concentration of Hf may be from about 9 to about 15 at %.

The HfInZnO-based oxide semiconductor layer may be formed to have a Zn concentration gradient in such a way that the concentration of Zn increases towards an upper portion of the oxide semiconductor layer 17 away from a lower portion of the oxide semiconductor layer 17 that contacts the gate insulating layer 15. The Zn concentration gradient of the HfInZnO-based oxide semiconductor layer may be obtained by varying the powers applied to the targets according to the sputtering time. Optionally, the concentration of Hf may be from about 9 to about 15 at %.

Due to the oxide semiconductor layer 17 having such Zn concentration gradient, an etch stop layer may not be formed, thereby simplifying the manufacturing processes of the thin film transistor.

Optionally, the etch stop layer (not shown) may be formed on the oxide semiconductor layer 17 as an insulating layer.

Figure 3D:
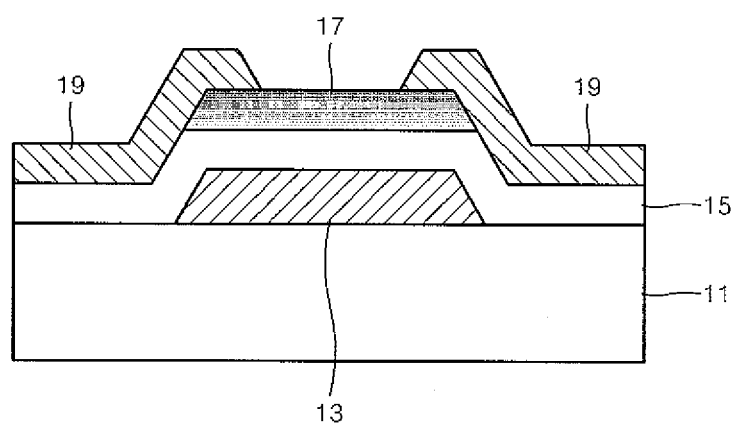

Referring to FIG. 3D, a conductive layer for example, a metal such as Ti, Pt, Ru, Cu, Au, Ag, Mo, Cr, Al, Ta, W, or alloys thereof, or a conductive oxide such as tin oxide, zinc oxide, indium oxide, ITO, IZO, GZO, IGO, or AZO is formed on the oxide semiconductor layer 17 and the gate insulating layer 15. The conductive layer comprising a metal or a conductive oxide is patterned to form the source and drain 19 respectively extending on both sides of the oxide semiconductor layer 17 and the gate insulating layer 15.

FIGS. 4A through 4D are cross-sectional views sequentially illustrating a method of manufacturing a thin film transistor, according to another embodiment. The method of manufacturing a thin film transistor of FIGS. 4A through 4D is the same as the method of manufacturing a thin film transistor of FIGS. 3A through 3D, except that the oxide semiconductor layer is double-layered in the present embodiment.

Figure 4A:
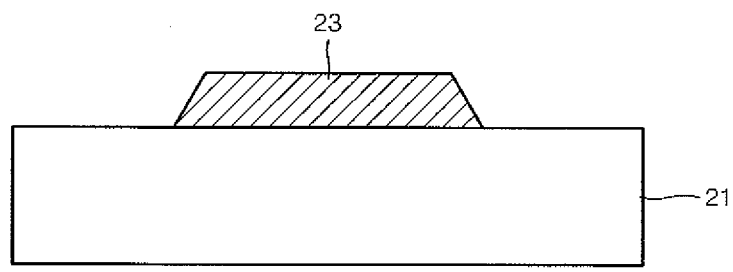
FIGS. 4A through 4D are cross-sectional views sequentially illustrating a method of manufacturing a thin film transistor, according to another embodiment.

Referring to FIG. 4A, the gate electrode 23 is formed on the substrate 21. The substrate 21 may be for example, Si, glass, or plastic.

A conductive layer comprising, for example, a metal such as Ti, Pt, Ru, Cu, Au, Ag, Mo, Cr, Al, Ta, W, or alloys thereof, or a conductive oxide such as tin oxide, zinc oxide, indium oxide, ITO, IZO, GZO, IGO, or AZO is formed on the substrate 21, and patterned to form the gate electrode 23. Optionally, a buffer layer (not shown) is formed on the substrate 21, and the gate electrode 23 may be then formed thereon.

Figure 4B:
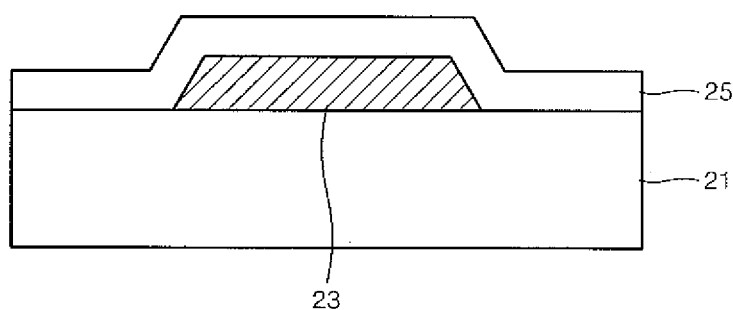

Referring to FIG. 4B, the gate insulating layer 25 is formed on the substrate 21 on which the gate electrode 23 is formed, wherein the gate insulating layer 25 comprises, for example, a dielectric material such as $SiO_2$, $SiN_x$, SiON, $HfO_2$, $Al_2O_3$—, $Y_2O_3$, or $Ta_2O_5$, a high-K dielectric material, or mixtures thereof.

Figure 4C:
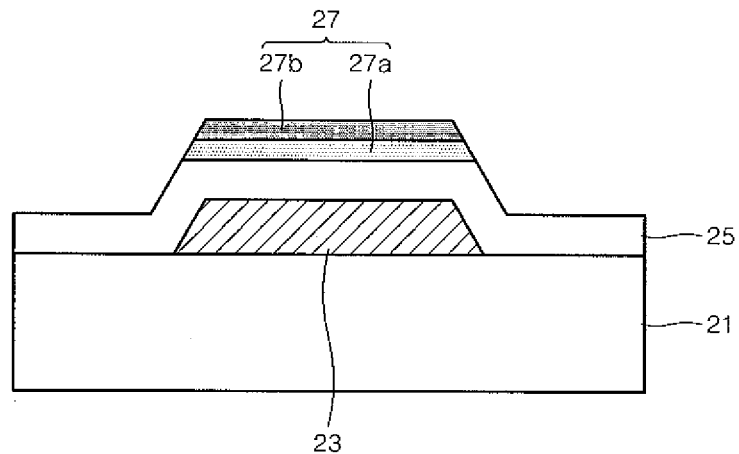

Referring to FIG. 4C, an HfInZnO-based oxide semiconductor layer is formed on the gate insulating layer 25, and patterned to form the oxide semiconductor layer 27. In this regard, the oxide semiconductor layer 27 includes a first oxide semiconductor layer 27a formed on the gate insulating layer 25 and a second oxide semiconductor layer 27b formed on the first oxide semiconductor layer 27a. In this regard, the concentration of Hf is higher in the second oxide semiconductor layer 27b than in the first oxide semiconductor layer 27a.

The first oxide semiconductor layer 27a and the second oxide semiconductor layer 27b may be respectively formed using targets having different compositions. In other words, the first oxide semiconductor layer 27a may be formed using a target for manufacturing an HfInZnO-based oxide semiconductor, wherein the concentration of Hf in the target is low, and the second oxide semiconductor layer 27b may be formed using a target for manufacturing an HfInZnO-based oxide semiconductor, wherein the concentration of Hf in the target is high. Each of the first oxide semiconductor layer 27a and the second oxide semiconductor layer 27b may be amorphous or crystalline.

Due to the second oxide semiconductor layer 27b, an etch stop layer may not be formed, thereby simplifying the manufacturing processes of the thin film transistor. Optionally, an etch stop layer (not shown) may be formed on the second oxide semiconductor layer 27b.

Alternatively, the oxide semiconductor layer 27 may be three-layered using three targets having different concentration compositions of Hf. In this regard, the concentration of Hf may be the lowest in a first oxide semiconductor layer formed right on the gate insulating layer 25, the concentration of Hf may be the highest in a third oxide semiconductor layer formed on the uppermost portion thereof, and the concentration of Hf may have a value between the highest and lowest values in a second oxide semiconductor layer formed therebetween.

The first oxide semiconductor layer 27a and the second oxide semiconductor layer 27b may also be formed in such a way that the concentration of Zn is higher in the second oxide semiconductor layer 27b than in the first oxide semiconductor layer 27a. In this regard, the first oxide semiconductor layer 27a may be formed using a target for manufacturing an HfInZnO-based oxide semiconductor, wherein the concentration of Zn in the target is low, and the second oxide semiconductor layer 27b may be formed using a target for manufacturing an HfInZnO-based oxide semiconductor, wherein the concentration of Zn in the target is high. The oxide semiconductor layer 27 may also be three-layered. In this regard, the concentration of Zn may be the lowest in a first oxide semiconductor layer formed right on the gate insulating layer 25, the concentration of Zn may be the highest in a third oxide semiconductor layer formed on the uppermost portion thereof. Optionally, the concentration of Hf in each of the first and second oxide semiconductor layers 27a and 27b may be from about 9 to about 15 at %.

Figure 4D:
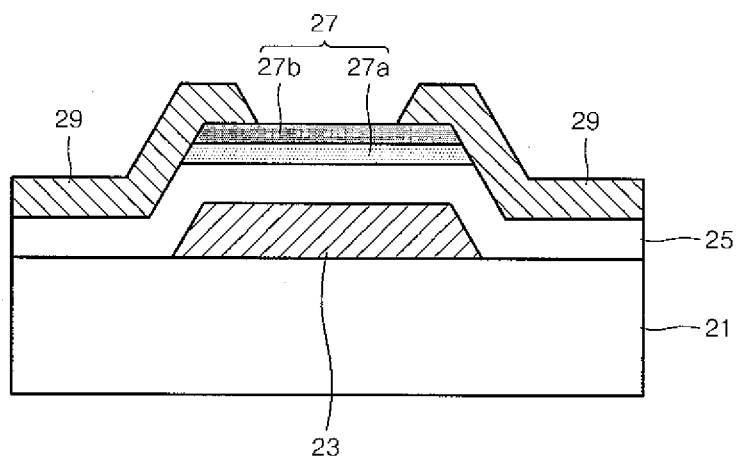

Referring to FIG. 4D, a conductive layer comprising a metal such as Ti, Pt, Ru, Cu, Au, Ag, Mo, Cr, Al, Ta, W, or alloys thereof, or a conductive oxide such as tin oxide, zinc oxide, indium oxide, ITO, IZO, GZO, IGO, or AZO is formed on the oxide semiconductor layer 27 and the gate insulating layer 25. The conductive layer comprising a metal or a conductive oxide is patterned to form the source and drain 29 respectively extending on both sides of the oxide semiconductor layer 27 and the gate insulating layer 25.

Figure 9:
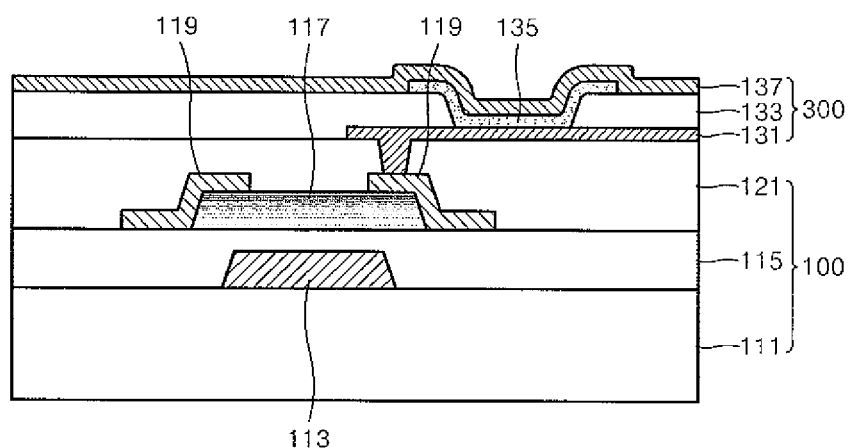
FIG. 9 is a cross-sectional view of an organic electroluminescent device including a thin film transistor, according to an embodiment.

FIG. 9 is a cross-sectional view of an organic electroluminescent device 300 including a thin film transistor, according to an embodiment.

Referring to FIG. 9, the organic electroluminescent device 300 includes an anode 131, a cathode 137, and an organic thin film layer 135 disposed between the anode 131 and the cathode 137. The organic thin film layer 135 may have a stacked structure including a hole transport layer, an organic emission layer, and an electron transport layer. The organic thin film layer 135 may further include a hole injection layer and an electron injection layer.

A thin film transistor 100 for controlling the operation of the organic electroluminescent device 300 has the structure of the HfInZnO-based oxide semiconductor thin film transistor described above. The thin film transistor 100 includes: a substrate 111; a gate electrode 113 formed on the substrate 111; an HfInZnO-based oxide semiconductor layer 117 formed on the gate insulating layer 115 to correspond to the gate electrode 113; and source and drain 119 respectively formed on both sides of the HfInZnO-based oxide semiconductor layer 117.

The concentration of Hf may increase towards an upper portion of the HfInZnO-based oxide semiconductor layer 117 away from a lower portion of the HfInZnO-based oxide semiconductor layer 117. Optionally, the HfInZnO-based oxide semiconductor layer 117 may have a staked structure in which the concentration of Hf is higher in an upper layer of the HfInZnO-based oxide semiconductor layer 117 than in a lower layer of the HfInZnO-based oxide semiconductor layer 117.

Alternatively, the HfInZnO-based oxide semiconductor layer 117 may have a Zn concentration gradient in such as way that the concentration of Zn is higher in an upper portion of the HfInZnO-based oxide semiconductor layer 117 than a lower portion thereof, or may have a stacked structure in which the concentration of Zn is higher in an upper layer of the HfInZnO-based oxide semiconductor layer 117 than a lower layer thereof.

The anode 131 is electrically connected to any one of the source and drain 119. The organic electroluminescent device 300 may further include a capacitor for maintaining a signal.
Measurement of Characteristics and Stability of HfInZnO-Based Oxide Semiconductor Thin Film Transistor (TFT)

A gate electrode comprising Mo was formed on a glass substrate to have a thickness of 1000 Å, a width of 150 nm, and a length of 1000 nm, and a gate insulating layer comprising $SiN_x$ and $SiO_x$ was formed on the glass substrate and the gate electrode to have thicknesses of 400 Å and 800 Å, respectively. An HfInZnO-based oxide semiconductor layer was formed on the gate insulating layer to have a thickness of 300 to 500 Å.

The HfInZnO-based oxide semiconductor layer was formed by co-sputtering by respectively applying powers to three targets of $HfO_2$, $In_2O_3$, and ZnO in a sputter chamber and then patterned.

Subsequently, $In_2O_3$ was formed on the HfInZnO-based oxide semiconductor layer to have a thickness of 1000 Å and patterned to form source/drain electrodes respectively extending on both sides of the HfInZnO-based oxide semiconductor layer and the substrate.

During the formation of the HfInZnO-based oxide semiconductor layer, an atomic ratio of Zn to In and the concentration (at %) of Hf in the HfInZnO-based oxide semiconductor layer were varied by adjusting the powers respectively applied to the targets. The electrical characteristics of a thin film transistor including an oxide semiconductor layer having a different atomic ratio of Zn to In and different Hf concentration compositions were measured.

Figure 5:
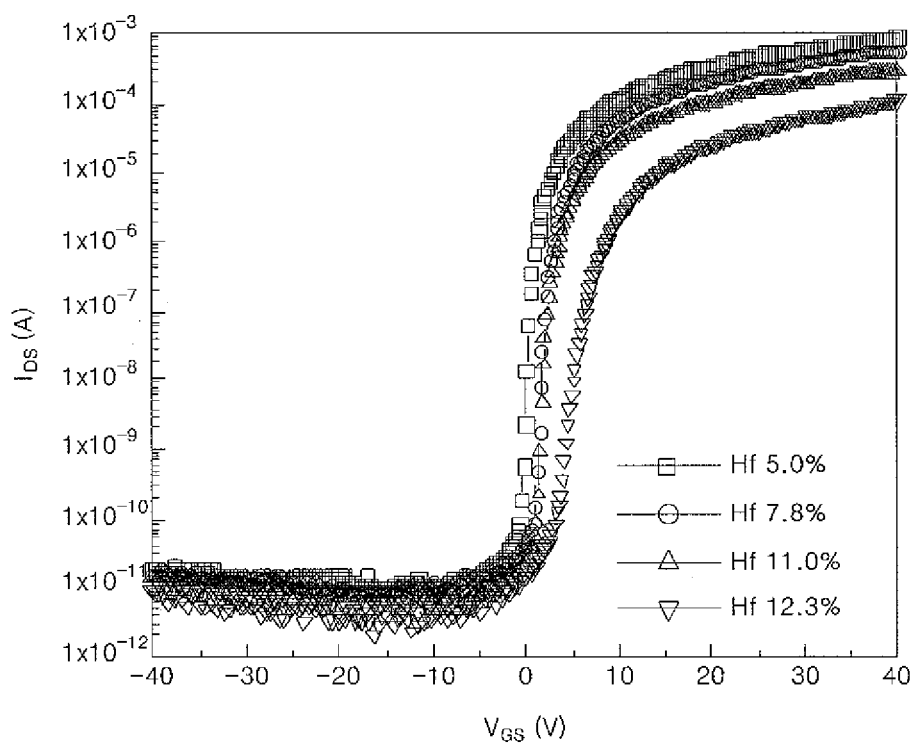
FIG. 5 is a graph showing measurement results of drain current with respect to gate voltage of a thin film transistor according to the concentration of Hf in an HfInZnO-based oxide semiconductor (Zn/In <1), according to an embodiment.
Figure 6:
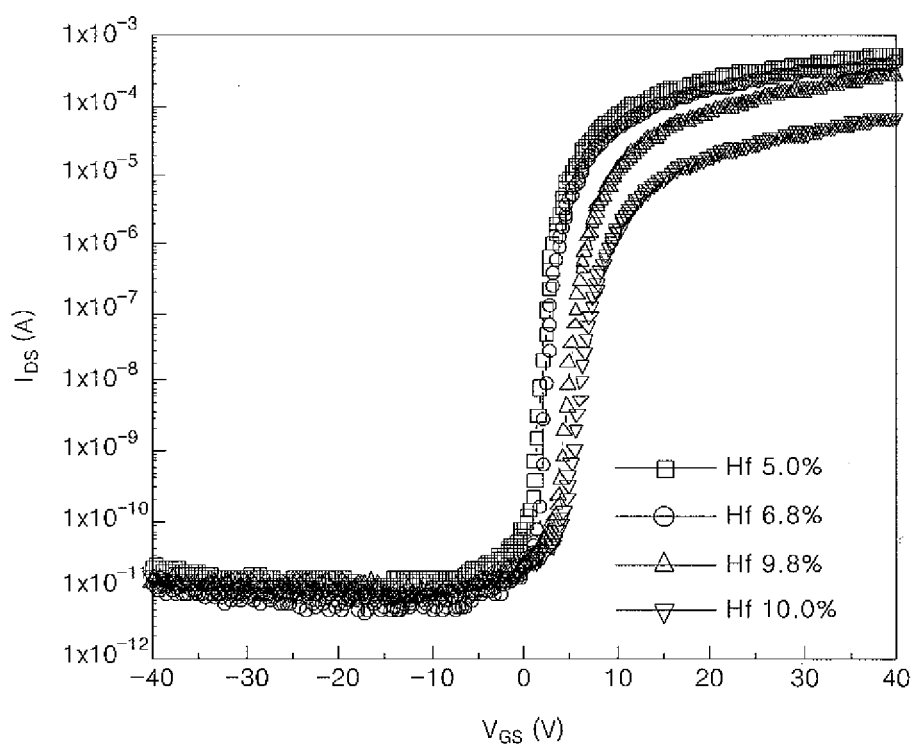
FIG. 6 is a graph showing measurement results of drain current with respect to gate voltage of a thin film transistor according to the concentration of Hf in an HfInZnO-based oxide semiconductor (Zn/In=1), according to an embodiment.

FIG. 5 is a graph showing measurement results of drain current with respect to gate voltage of a thin film transistor according to the concentration of Hf in an HfInZnO-based oxide semiconductor, when an atomic ratio Zn to In was smaller than 1 (Zn/In <1), according to an embodiment. FIG. 6 is a graph showing measurement results of drain current with respect to gate voltage of a thin film transistor according to the concentration of Hf in an HfInZnO-based oxide semiconductor, when an atomic ratio of Zn to In was 1 (Zn/In=1), according to an embodiment.

In FIG. 5, when Zn/In <1, drain current ($I_{DS}$) with respect to gate voltage ($V_{GS}$) was measured by varying the concentration (atomic percentage) of Hf to 5.0 at %, 7.8 at %, 11.0 at %, and 12.3 at %. Referring to FIG. 5, it is confirmed that as the concentration of Hf in the HfInZnO-based oxide semiconductor increases, the gate voltage ($V_{GS}$) increases with respect to the same drain current ($I_{DS}$). It is assumed that as the concentration of Hf increases, the electron mobility of the HfInZnO-based oxide semiconductor decreases, so that a higher gate voltage ($V_{GS}$) is required for the same drain current ($I_{DS}$).

In FIG. 6, when Zn/In=1, drain current ($I_{DS}$) with respect to gate voltage ($V_{GS}$) was measured by varying the concentration of Hf to 5.0 at %, 6.8 at %, 9.8 at %, and 10.0 at %. Referring to FIG. 6, as the results shown in the graph of FIG. 5, it is confirmed that as the concentration of Hf in the HfInZnO-based oxide semiconductor increases, the gate voltage ($V_{GS}$) increases with respect to the same drain current ($I_{DS}$).

Table 1 below shows measurement results of the characteristics and stability of the HfInZnO-based oxide semiconductor TFT when Zn/In <1, and the measurement results of the characteristics and stability of the HfInZnO-based oxide semiconductor TFT of Table 1 are illustrated as a graph in FIG. 7.

TABLE 1

| Zn:In | Hf (at %) | $V_{TH}$ (V) | Mobility (cm$^2$/V·s) | S-factor (V/dec) | $\Delta V$ (V) |
|---|---|---|---|---|---|
| 38:55 | 5.0 | 0.08 | 16.96 | 0.28 | 10.1 |
| 38:55 | 7.8 | 1.91 | 11.94 | 0.35 | 9.4 |
| 35:54 | 11.0 | 1.95 | 6.70 | 0.32 | 5.1 |
| 39:48 | 12.3 | 4.56 | 2.59 | 0.81 | 3.7 |

Figure 7:
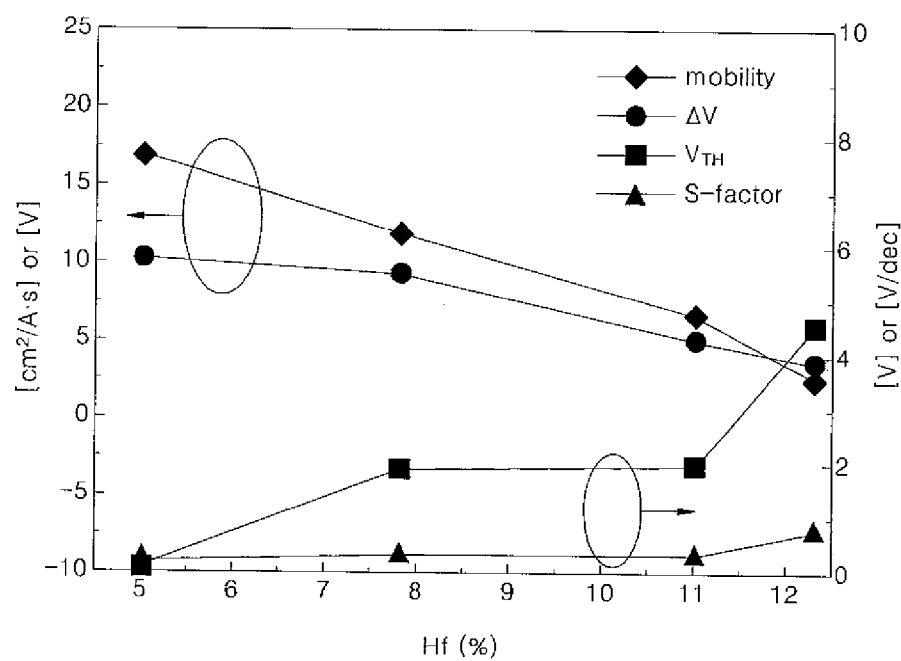
FIG. 7 is a graph showing measurement results of the characteristic and stability of an HfInZnO-based oxide semiconductor thin film transistor according to the concentration of Hf, when Zn/In >1, according to an embodiment.

In Table 1 and FIG. 7, Zn:In denotes an atomic ratio of Zn to In in the HfInZnO-based oxide semiconductor, Hf (at %) denotes the concentration (atomic percentage) of Hf in the HfInZnO-based oxide semiconductor, $V_{TH}$ (threshold voltage) denotes a minimum voltage for forming a channel in a transistor so as to allow current flow, and mobility denotes an average velocity of a carrier (electron) in the HfInZnO-based oxide semiconductor. In addition, S-factor (sub-threshold swing) denotes the inverse of the slope of the graph of FIG. 7 in a section where the HfInZnO-based oxide semiconductor TFT acts as a switching device, $\Delta V$ denotes a change of threshold voltage $V_{TH}$ before and after the HfInZnO-based oxide semiconductor is under DC stress, and the DC stress denotes a change of $V_{TH}$ ($\Delta V_{TH}$) when a gate bias voltage of ±5 V was applied to the HfInZnO-based oxide semiconductor for 1 hour.

Referring to Table 1 and FIG. 7, as the concentration of Hf in the HfInZnO-based oxide semiconductor increases, the threshold voltage ($V_{TH}$) increases, the mobility of the HfInZnO-based oxide semiconductor decreases, and the S-factor increases. From the results, it is confirmed that as the concentration of Hf in the HfInZnO-based oxide semiconductor increases, the electrical characteristics of the TFT are deteriorated, on the other hand, the stability of the TFT is enhanced.

Table 2 below shows measurement results of the characteristics and stability of the HfInZnO-based oxide semiconductor TFT when Zn/In=1, and the measurement results of the characteristics and stability of the HfInZnO-based oxide semiconductor TFT of Table 2 are illustrated as a graph in FIG. 8.

TABLE 2

| Zn:In | Hf (at %) | $V_{TH}$ (V) | Mobility (cm$^2$/V·s) | S-factor (V/dec) | $\Delta V$ (V) |
|---|---|---|---|---|---|
| 49:46 | 5.0 | 0.86 | 22.88 | 0.33 | 9.4 |
| 48:45 | 6.8 | 2.43 | 10.78 | 0.30 | 6.2 |
| 44:46 | 9.8 | 1.48 | 5.01 | 0.54 | 3.7 |
| 46:43 | 10.0 | 5.81 | 2.13 | 0.77 | 4.2 |

Figure 8:
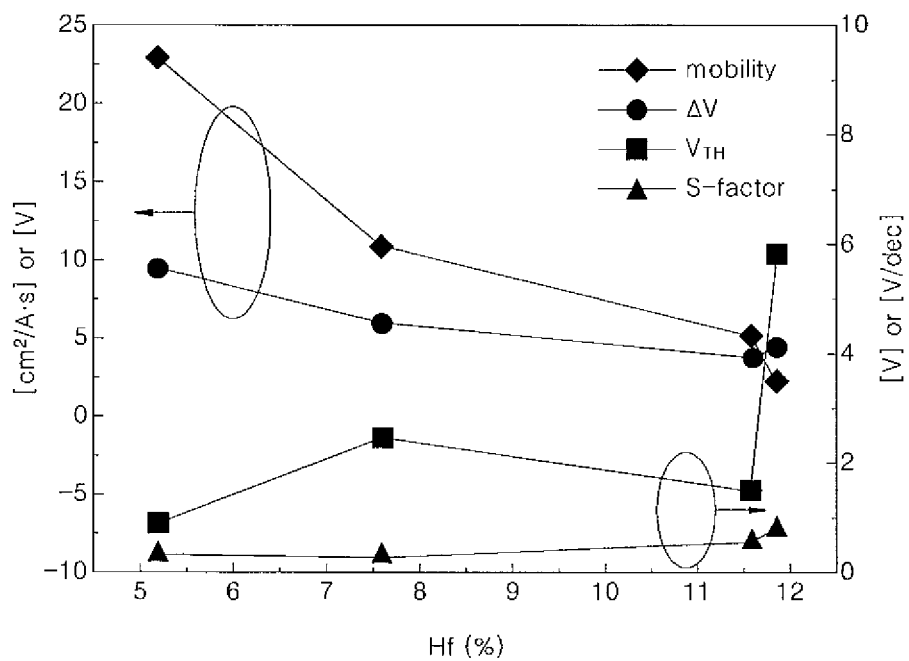
FIG. 8 is a graph showing measurement results of the characteristic and stability of an HfInZnO-based oxide semiconductor thin film transistor according to the concentration of Hf, when Zn/In=1, according to an embodiment.

Referring to Table 2 and FIG. 8, like the case when Zn:In <1 described above, as the atomic percentage of Hf increases, the threshold voltage ($V_{TH}$) increases, the mobility decreases, and the S-factor increases, thereby deteriorating the electrical characteristics of the HfInZnO-based oxide semiconductor TFT. On the other hand, as the concentration of Hf increases, the $\Delta V$ decreases, thereby enhancing the stability of the HfInZnO-based oxide semiconductor TFT.

In other words, when Zn>In and Zn=In, as the concentration of Hf increases, the threshold voltage ($V_{TH}$) increases, the mobility decreases, and the S-factor increases, thereby deteriorating the electrical characteristics of the HfInZnO-based oxide semiconductor TFT, on the other hand, the $\Delta V$ decreases, thereby enhancing the stability of the HfInZnO-based oxide semiconductor TFT.

Comparing Table 1 and FIG. 7 with Table 2 and FIG. 8, with respect to the similar concentration of Hf, the threshold voltage ($V_{TH}$) is lower when Zn>In than when Zn=In, which indicates that the threshold voltage ($V_{TH}$) depends on the atomic ratio of Zn to In. On the other hand, the mobility, the S-factor, and the $\Delta V$ depend on the atomic percentage of Hf more than the atomic ratio of Zn to In.

In the aforementioned embodiments, bottom-gate inverted-staggered TFTs and methods of manufacturing the same are described, but the present embodiments are not limited thereto. For example, the TFT according to an embodiment may be a bottom-gate coplanar-type TFT.

As described above, according to the one or more of the above embodiments, a HfInZnO-based oxide semiconductor layer has a Hf or Zn concentration gradient, thereby enhancing the electrical characteristics of the HfInZnO-based oxide semiconductor layer as a channel layer and strengthening a portion of the HfInZnO-based oxide semiconductor layer that is exposed to the external agents. As a result, the stability of the HfInZnO-based oxide semiconductor TFT may be enhanced.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A method of manufacturing a thin film transistor, the method comprising:
   forming a gate electrode on a substrate;
   forming a gate insulating layer on the gate electrode and exposed portions of the substrate;
   forming an HfInZnO-based oxide semiconductor layer on the gate insulating layer; and
   forming source and drain regions respectively extending on both sides of the oxide semiconductor layer and the gate insulating layer;
   wherein the forming of the oxide semiconductor layer is performed in such a way that the concentration of Zn increases towards an upper portion of the oxide semiconductor layer away from a lower portion of the oxide semiconductor layer.

2. The method of claim 1, wherein the oxide semiconductor layer comprises a first layer formed on the gate insulating layer and a second layer formed on the first layer, wherein the concentration of Zn is higher in the second layer than in the first layer.

3. A method of manufacturing a thin film transistor, the method comprising:
   forming a gate electrode on a substrate;

forming a gate insulating layer on the gate electrode and exposed portions of the substrate;

forming an HfInZnO-based oxide semiconductor layer on the gate insulating layer; and forming source and drain regions respectively extending on both sides of the oxide semiconductor layer and the gate insulating layer;

wherein the forming of the oxide semiconductor layer is performed in such a way that the concentration of Hf increases towards an upper portion of the oxide semiconductor layer away from a lower portion of the oxide semiconductor layer.

4. The method of claim 3, wherein the forming of the oxide semiconductor layer is performed in such a way that the concentration of Hf is from about 9 to about 15 atomic percent based on 100 atomic percent of the total concentration of Hf, In, and Zn.

5. The method of claim 3, wherein the forming of the oxide semiconductor layer is performed by co-sputtering by respectively applying powers to three targets of $HfO_2$, $In_2O_3$, and ZnO.

6. The method of claim 3, wherein the oxide semiconductor layer comprises a first layer formed on the gate insulating layer and a second layer formed on the first layer, wherein the concentration of Hf is higher in the second layer than in the first layer.

7. A thin film transistor comprising:
a substrate;
a gate electrode formed on the substrate;
a gate insulating layer formed on the gate electrode and exposed portions of the substrate;
an oxide semiconductor layer formed on the gate insulating layer comprising an HfInZnO-based oxide semiconductor; and
source and drain regions respectively formed to extend on both sides of the oxide semiconductor layer and the gate insulating layer;
wherein the concentration of Zn gradually increases towards an upper portion of the oxide semiconductor layer away from a lower portion of the oxide semiconductor layer.

8. The thin film transistor of claim 7, wherein the oxide semiconductor layer comprises a first layer formed on the gate insulating layer and a second layer formed on the first layer, wherein the concentration of Zn is higher in the second layer than in the first layer.

9. A thin film transistor comprising:
a substrate;
a gate electrode formed on the substrate;
a gate insulating layer formed on the gate electrode and exposed portions of the substrate;
an oxide semiconductor layer formed on the gate insulating layer comprising an HfInZnO-based oxide semiconductor; and
source and drain regions respectively formed to extend on both sides of the oxide semiconductor layer and the gate insulating layer;
wherein the concentration atomic percent of Hf gradually increases towards an upper portion of the oxide semiconductor layer away from a lower portion of the oxide semiconductor layer.

10. The thin film transistor of claim 9, wherein the concentration of Hf in the oxide semiconductor layer from about 9 to about 15 atomic percent based on 100 atomic percent of the total concentration of Hf, In, and Zn.

11. The thin film transistor of claim 9, wherein the oxide semiconductor layer comprises a first layer formed on the gate insulating layer and a second layer formed on the first layer, wherein the concentration of Hf is higher in the second layer than in the first layer.

12. The thin film transistor of claim 11, wherein the concentration of Hf in the first layer is from about 3 to about 15 atomic percent, and the concentration of Hf in the second layer is from about 4 to about 15 atomic percent.

13. The thin film transistor of claim 9, wherein the oxide semiconductor layer is amorphous.

14. The thin film transistor of claim 9, wherein the oxide semiconductor layer is crystalline.

15. The thin film transistor of claim 9, wherein the substrate comprises silicon, glass, or plastic.

16. The thin film transistor of claim 9, wherein the gate electrode comprises a metal.

17. The thin film transistor of claim 16, wherein the metal is at least one selected from the group consisting of: titanium (Ti), platinum (Pt), ruthenium (Ru), copper (Cu), gold (Au), silver (Ag), molybdenum (Mo), chromium (Cr), aluminum (Al), tantalum (Ta), tungsten (W), or alloys thereof, or a conductive oxide such as tin oxide, zinc oxide, indium oxide, indium thin oxide (ITO), indium zinc oxide (IZO), gallium zinc oxide (GZO), indium gallium oxide (IGO), and aluminum zinc oxide (AZO).

18. The thin film transistor of claim 9, wherein the gate insulating layer comprises any one of $SiO_2$, $SiN_x$, SiON, $HfO_2$, $Al_2O_3$, $Y_2O_3$, $Ta_2O_5$, and mixtures thereof.

19. The thin film transistor of claim 9, further comprising a buffer layer formed between the substrate and the gate electrode.

20. The thin film transistor of claim 9, further comprising an etch stop layer formed on the oxide semiconductor layer.

21. An organic electroluminescent apparatus comprising: an organic electroluminescent device comprising a first electrode, an organic thin film layer, and a second electrode; and a thin film transistor configured to control the organic electroluminescent device, the thin film transistor comprising: a substrate; a gate electrode formed on the substrate; a gate insulating layer formed on the gate electrode and exposed portions of the substrate; an oxide semiconductor layer formed on the gate insulating layer comprising an HfInZnO-based oxide semiconductor, wherein the concentration of Hf is from about 9 to about 15 atomic percent based on 100 atomic percent of the total concentration of Hf, In, and Zn, and increases towards an upper portion of the oxide semiconductor layer and away from a lower portion of the oxide semiconductor layer; and source and drain regions respectively formed to extend on both sides of the oxide semiconductor layer and the gate insulating layer.

* * * * *